US008120032B2

(12) United States Patent
Chen et al.

(10) Patent No.: US 8,120,032 B2
(45) Date of Patent: Feb. 21, 2012

(54) ACTIVE DEVICE ARRAY SUBSTRATE AND FABRICATION METHOD THEREOF

(75) Inventors: Shih-Chin Chen, Taoyuan County (TW); Wen-Chuan Wang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 621 days.

(21) Appl. No.: 12/242,932

(22) Filed: Oct. 1, 2008

(65) Prior Publication Data

US 2009/0218571 A1    Sep. 3, 2009

(30) Foreign Application Priority Data

Feb. 29, 2008    (TW) ................................. 97106985 A

(51) Int. Cl.
*H01L 27/12* (2006.01)

(52) U.S. Cl. .................... 257/59; 257/49; 257/E27.131; 349/42; 349/43; 349/139

(58) Field of Classification Search .................... 257/59, 257/E25.001
See application file for complete search history.

(56) References Cited

U.S. PATENT DOCUMENTS

| | | | |
|---|---|---|---|
| 4,684,435 A | 8/1987 | Kishi et al. | |
| 5,474,941 A * | 12/1995 | Mitani et al. | 438/151 |
| 5,478,766 A | 12/1995 | Park et al. | |
| 6,818,488 B2 * | 11/2004 | Joubert et al. | 438/179 |
| 6,858,907 B2 * | 2/2005 | Ryu et al. | 257/412 |
| 7,132,689 B2 | 11/2006 | Ahn et al. | |
| 7,553,711 B2 * | 6/2009 | Park | 438/158 |
| 2002/0100945 A1 * | 8/2002 | Mandelman et al. | 257/401 |
| 2002/0142523 A1 * | 10/2002 | Ryu et al. | 438/149 |
| 2002/0155665 A1 * | 10/2002 | Doris et al. | 438/279 |
| 2002/0168842 A1 * | 11/2002 | Nguyen et al. | 438/585 |
| 2003/0049876 A1 * | 3/2003 | Mori et al. | 438/23 |
| 2004/0263746 A1 * | 12/2004 | Cho et al. | 349/139 |
| 2005/0243230 A1 | 11/2005 | Chen | |
| 2006/0079036 A1 * | 4/2006 | Su et al. | 438/158 |
| 2007/0153204 A1 * | 7/2007 | Kim et al. | 349/141 |
| 2007/0158648 A1 * | 7/2007 | Suh et al. | 257/40 |
| 2007/0166902 A1 * | 7/2007 | Orlowski et al. | 438/197 |
| 2008/0003726 A1 * | 1/2008 | Park | 438/149 |
| 2008/0111136 A1 * | 5/2008 | Qiu et al. | 257/72 |
| 2008/0129664 A1 * | 6/2008 | Lin et al. | 345/87 |
| 2008/0135845 A1 * | 6/2008 | Heo et al. | 257/59 |
| 2008/0224141 A1 * | 9/2008 | Nam et al. | 257/59 |
| 2010/0084738 A1 * | 4/2010 | Masuda | 257/532 |

\* cited by examiner

*Primary Examiner* — Victor A Mandala
*Assistant Examiner* — William Harriston
(74) *Attorney, Agent, or Firm* — Jianq Chyun IP Office

(57) ABSTRACT

A fabrication method of an active device array substrate is disclosed. A first metal material layer, a gate insulation material layer, a channel material layer, a second metal material layer, and a first photoresist layer are formed over a substrate sequentially. The first photoresist layer is patterned with a multi-tone mask to form a first patterned photoresist layer with two thicknesses. A first and second removing processes are performed sequentially using the first patterned photoresist layer as a mask to form a gate, a gate insulation layer, a channel layer, and a source/drain. The first patterned photoresist layer is removed. A passivation layer and a second patterned photoresist layer are formed over the substrate. A third removing process is performed to form a plurality of contact holes. A pixel electrode material layer is formed over the substrate. The second patterned photoresist layer is lifted off to form a pixel electrode.

3 Claims, 15 Drawing Sheets

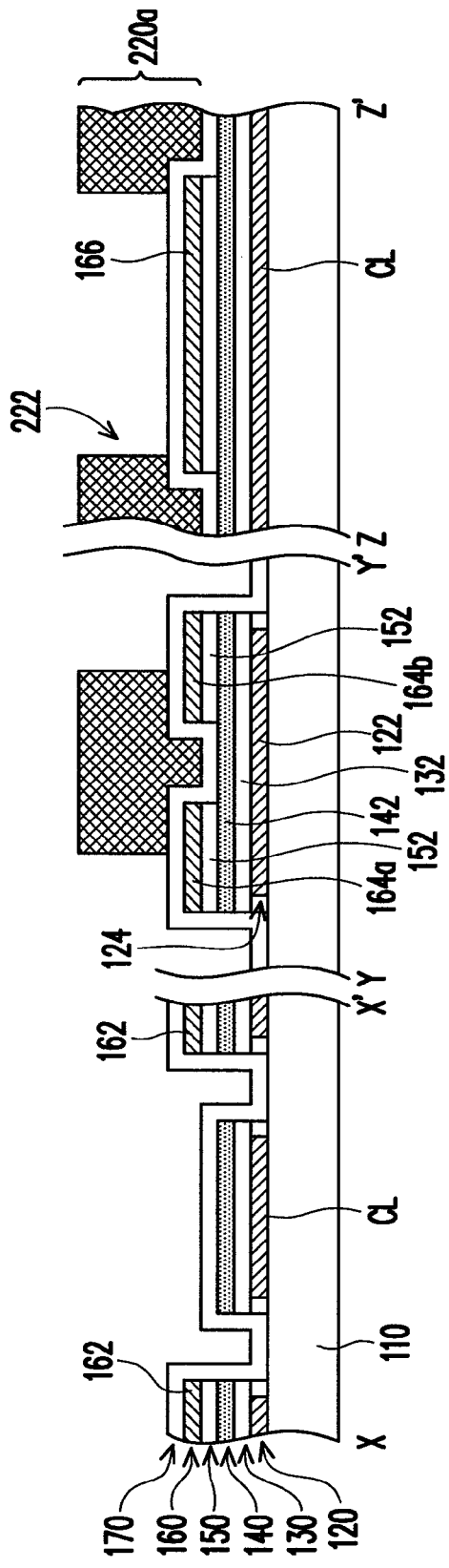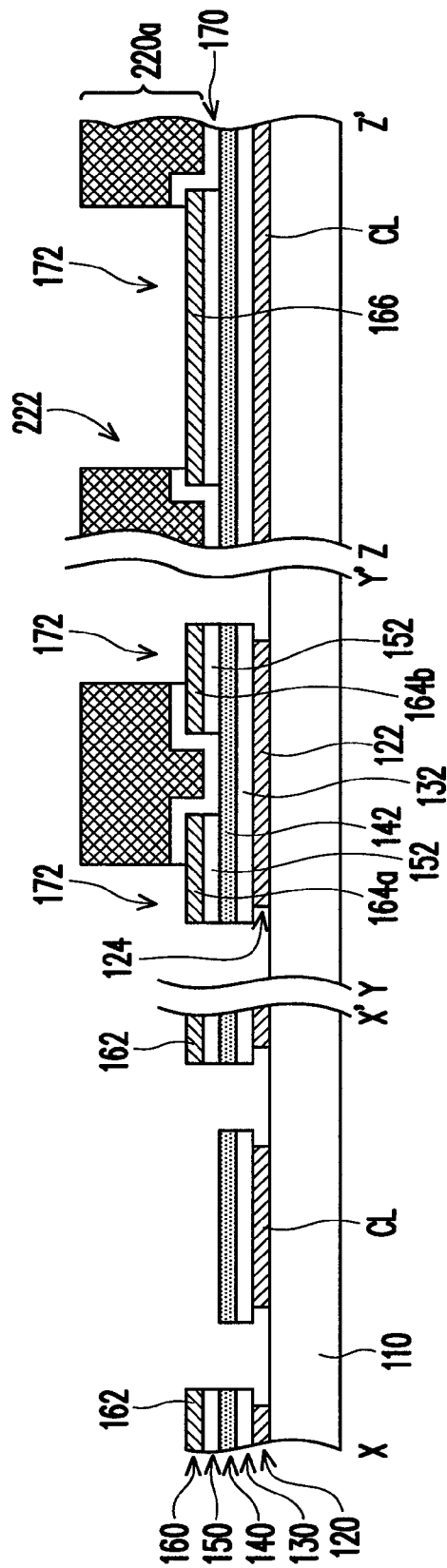

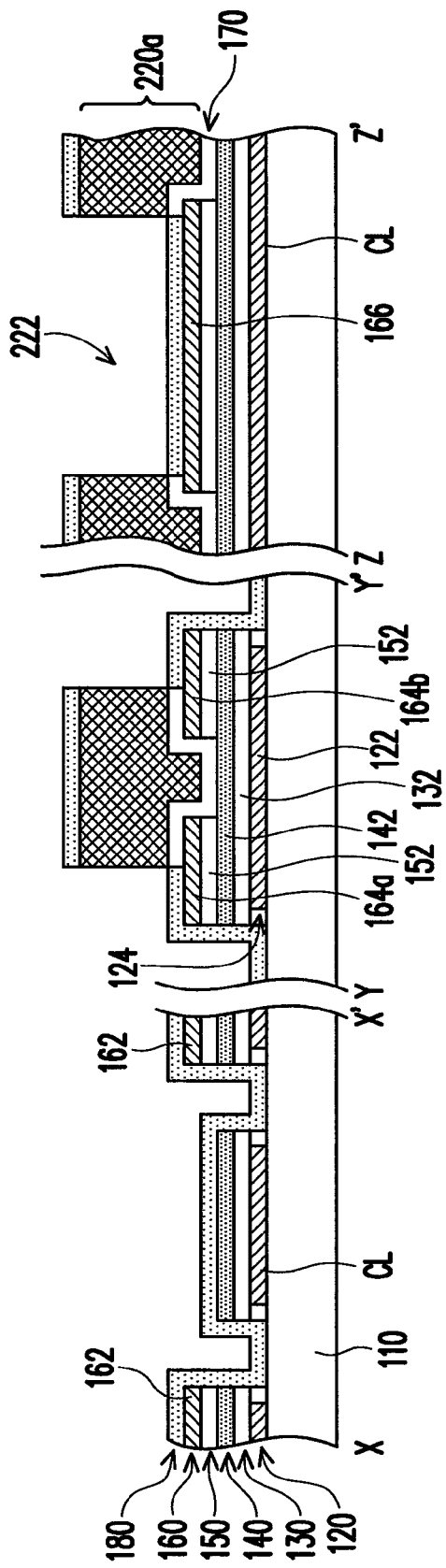
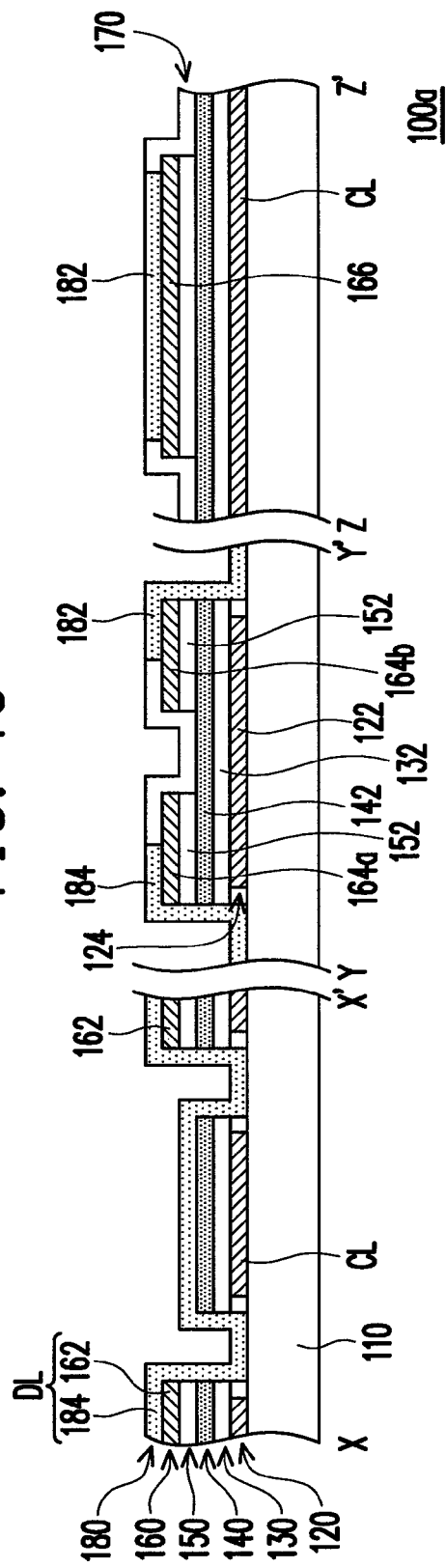
FIG. 1G
FIG. 1H

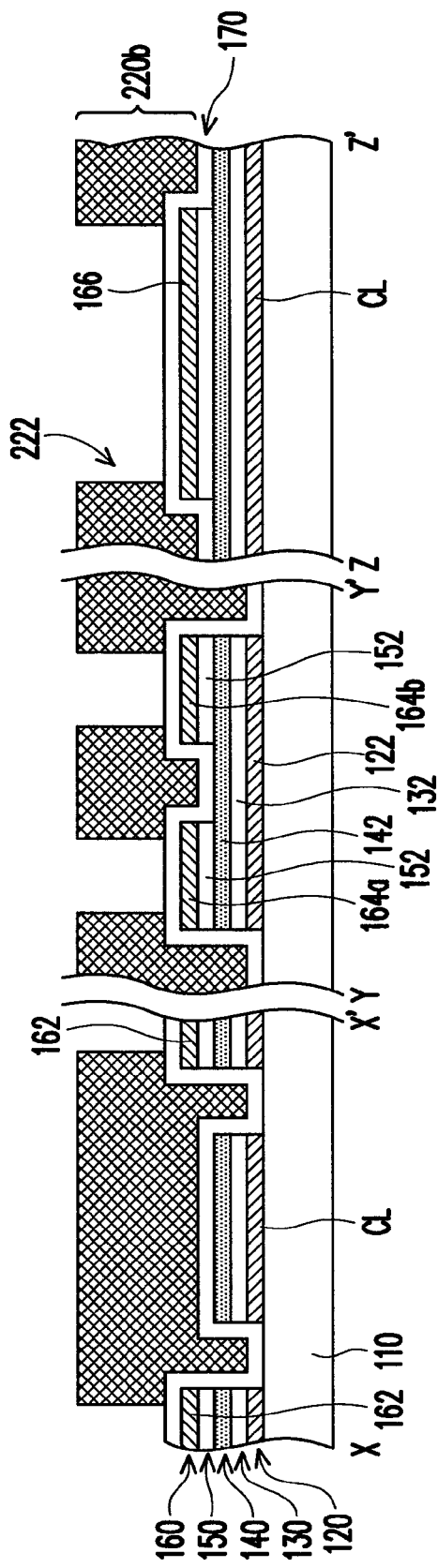
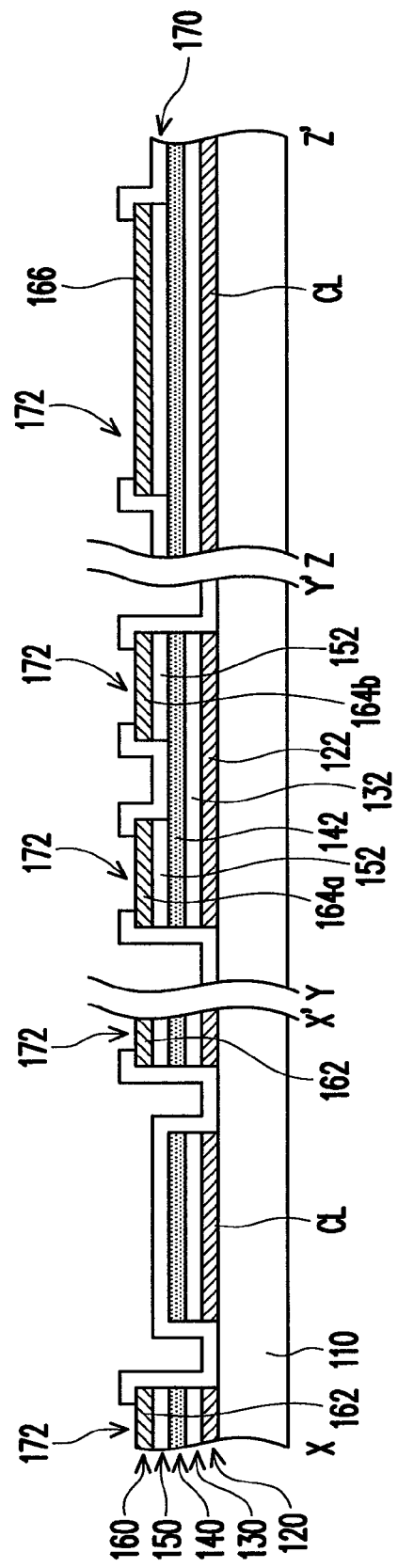
FIG. 3E
FIG. 3F

ACTIVE DEVICE ARRAY SUBSTRATE AND FABRICATION METHOD THEREOF

CROSS-REFERENCE TO RELATED APPLICATION

This application claims the priority benefit of Taiwan application serial no. 97106985, filed on Feb. 29, 2008. The entirety of the above-mentioned patent application is hereby incorporated by reference herein and made a part of specification.

BACKGROUND OF THE INVENTION

1. Field of the Invention

The present invention generally relates to an active device array substrate and a fabrication method thereof, and more particularly, to an active device array substrate and a fabrication method thereof which uses a multi-tone mask for reducing the number of masks required for fabricating the active device array substrate.

2. Description of Related Art

Presently, multimedia technology has become very developed due to the advancement of semiconductor devices or display apparatuses. Among various displays, thin film transistor liquid crystal display (TFT-LCD) has become the mainstream in today's display market for it has such characteristics as high image quality, high space efficiency, low power consumption, and no radiation.

A TFT-LCD includes a TFT array substrate, a color filter substrate, and a liquid crystal layer between the TFT array substrate and the color filter substrate. Generally speaking, at least five mask processes are required to fabricate a conventional TFT array substrate. The first mask process is used to define a gate and a scan line, the second mask process is used to define a channel layer, the third mask process is used to define a source, a drain, and a data line, the fourth mask process is used to define a passivation layer, and the fifth mask process is used to define a pixel electrode.

Because the number of mask processes performed will directly affect the fabrication cost and the fabrication time of the entire TFT array substrate, every manufacturer in the industry is trying to reduce the number of mask processes required for fabricating TFT array substrates. Therefore, a fabrication method of a TFT array substrate which can increase the throughput and reduce the fabrication cost is highly desired.

SUMMARY OF THE INVENTION

Accordingly, the present invention is directed to an active device array substrate and a fabrication method thereof, wherein both the fabrication cost and the fabrication time are effectively reduced.

The present invention provides a fabrication method of an active device array substrate. The fabrication method comprises the following steps. First, a substrate and a multi-tone mask are provided. Next, a first metal material layer is formed over the substrate. Next, a gate insulation material layer is formed over the first metal material layer. After that, a channel material layer is formed over the gate insulation material layer. Next, a second metal material layer is formed over the channel material layer. After that, a first photoresist layer is formed over the second metal material layer, and the first photoresist layer is patterned with the multi-tone mask to form a first patterned photoresist layer, wherein the first patterned photoresist layer comprises a concave pattern, and a part of the second metal material layer is exposed by the first patterned photoresist layer. Next, a first removing process is performed using the first patterned photoresist layer as a mask to remove the second metal material layer, the channel material layer, the gate insulation material layer, and the first metal material layer not covered by the first patterned photoresist layer, so as to form a gate, a gate insulation layer, and a channel layer. After that, a second removing process is performed to remove the concave pattern of the first patterned photoresist layer and the second metal material layer under the concave pattern, so as to form a source/drain and expose a part of the channel layer. Next, the first patterned photoresist layer is removed. After that, a passivation layer is formed over the substrate to cover a part of the substrate, the source/drain, and a part of the channel layer. Next, a second patterned photoresist layer is formed over the passivation layer, wherein the passivation layer above the source/drain is exposed by the second patterned photoresist layer. After that, a third removing process is performed using the second patterned photoresist layer as a mask to remove a part of the passivation layer and form a plurality of contact holes, so as to expose the source/drain. Next, a pixel electrode material layer is formed over the passivation layer to cover the second patterned photoresist layer and the exposed source/drain. After that, the second patterned photoresist layer is lifted off to remove the pixel electrode material layer over the second patterned photoresist layer, so as to form a pixel electrode.

According to an embodiment of the present invention, the multi-tone mask comprises a half-tone mask.

According to an embodiment of the present invention, the first removing process further comprises over etching the first metal material layer to form an undercut concave at a side of the gate.

According to an embodiment of the present invention, a scan line electrically connected to the gate and a common line are further formed while the gate is formed.

According to an embodiment of the present invention, a storage capacitance electrode is further formed above the common line while the source/drain is formed.

According to an embodiment of the present invention, a plurality of first sub data line segments is further formed while the gate is formed.

According to an embodiment of the present invention, a plurality of second sub data line segments is further formed along the extending direction of the first sub data line segments while the pixel electrode is formed over the passivation layer. One of the second sub data line segments is electrically connected to the source through the corresponding contact hole, and the second sub data line segments are electrically connected to the first sub data line segments to form a data line.

According to an embodiment of the present invention, the second sub data line segments are electrically connected between two of the first sub data line segments through a part of the contact holes of the passivation layer.

According to an embodiment of the present invention, the first removing process comprises a wet etching process.

According to an embodiment of the present invention, the second removing process comprises a dry etching process.

According to an embodiment of the present invention, an ohmic contact material layer is further formed over the channel material layer after the channel material layer is formed.

According to an embodiment of the present invention, the second removing process further comprises removing a part of the ohmic contact material layer to form an ohmic contact layer.

The present invention further provides a fabrication method of an active device array substrate. The fabrication method comprises the following steps. First, a substrate and a multi-tone mask are provided. Next, a first metal material layer is formed over the substrate. Next, a gate insulation material layer is formed over the first metal material layer. After that, a channel material layer is formed over the gate insulation material layer. Next, a second metal material layer is formed over the channel material layer. After that, a first photoresist layer is formed over the second metal material layer, and the first photoresist layer is patterned with the multi-tone mask to form a first patterned photoresist layer, wherein the first patterned photoresist layer comprises a concave pattern, and a part of the second metal material layer is exposed by the first patterned photoresist layer. Next, a first removing process is performed using the first patterned photoresist layer as a mask to remove the second metal material layer, the channel material layer, the gate insulation material layer, and the first metal material layer not covered by the first patterned photoresist layer, so as to form a gate, a gate insulation layer, and a channel layer. After that, a second removing process is performed to remove the concave pattern of the first patterned photoresist layer and the second metal material layer under the concave pattern, so as to form a source/drain and expose a part of the channel layer. Next, the first patterned photoresist layer is removed. After that, a passivation layer is formed over the substrate to cover a part of the substrate, the source/drain, and a part of the channel layer. Next, a second patterned photoresist layer is formed over the passivation layer, wherein the passivation layer above the source/drain is exposed by the second patterned photoresist layer. After that, a third removing process is performed using the second patterned photoresist layer as a mask to remove a part of the passivation layer and form a plurality of contact holes, so as to expose the source/drain. Next, the second patterned photoresist layer is removed. After that, a pixel electrode is formed over the passivation layer, wherein the pixel electrode is filled into the contact holes and is electrically connected to the drain.

According to an embodiment of the present invention, the multi-tone mask comprises a half-tone mask.

According to an embodiment of the present invention, a scan line electrically connected to the gate and a common line are further formed while the gate is formed.

According to an embodiment of the present invention, a storage capacitance electrode is further formed above the common line while the source/drain is formed.

According to an embodiment of the present invention, a plurality of first sub data line segments is further formed while the gate is formed.

According to an embodiment of the present invention, a plurality of second sub data line segments is further formed along the extending direction of the first sub data line segments while the pixel electrode is formed over the passivation layer. One of the second sub data line segments is electrically connected to the source through the corresponding contact hole, and the second sub data line segments are electrically connected to the first sub data line segments to form a data line.

According to an embodiment of the present invention, the second sub data line segments are electrically connected between two of the first sub data line segments through some of the contact holes of the passivation layer.

According to an embodiment of the present invention, the first removing process comprises a wet etching process.

According to an embodiment of the present invention, the second removing process comprises a dry etching process.

According to an embodiment of the present invention, an ohmic contact material layer is further formed over the channel material layer after the channel material layer is formed.

According to an embodiment of the present invention, the second removing process further comprises removing a part of the ohmic contact material layer to form an ohmic contact layer.

According to an embodiment of the present invention, the step of forming the pixel electrode comprises the following steps. A pixel electrode material layer is formed over the passivation layer to cover the passivation layer and the exposed source/drain. Next, a third patterned photoresist layer is formed over the passivation layer. After that, the pixel electrode material layer is pattered using the third patterned photoresist layer as a mask to form the pixel electrode.

The present invention further provides an active device array substrate including a substrate, a scan line, an active device, a passivation layer, a pixel electrode, a plurality of first sub data line segments, and a plurality of second sub data line segments. The scan line and the active device are both disposed over the substrate, wherein the active device includes a gate, a gate insulation layer, a channel layer, and a source/drain. The gate is disposed over the substrate and is electrically connected to the scan line, and an undercut concave is formed at a side of the gate. The gate insulation layer is disposed over the gate, the channel layer is disposed over the gate insulation layer, and the source/drain is respectively disposed over both sides of the channel layer. The passivation layer covers the active device and the scan line and comprises a plurality of contact holes. A part of the contact holes expose the source/drain. The pixel electrode is disposed over the passivation layer and is electrically connected to the drain through a part of the contact holes. The first sub data line segments and the source/drain are located on the same layer, and the second sub data line segments and the pixel electrode are located on the same layer. The second sub data line segments are electrically connected between two of the first sub data line segments through a part of the contact holes to form a data line, and one of the second sub data line segments is electrically connected to the source through the corresponding contact hole.

According to an embodiment of the present invention, the active device array substrate further comprises a common line disposed over the substrate, and the common line and the gate are located on the same layer.

According to an embodiment of the present invention, the active device array substrate further comprises a storage capacitance electrode disposed above the common line, and the passivation layer is located between the storage capacitance electrode and the pixel electrode. The pixel electrode is electrically connected to the storage capacitance electrode through the corresponding contact holes.

The present invention provides a fabrication method of an active device array substrate, wherein a multi-tone mask is used for patterning a photoresist layer such that the patterned photoresist layer can have two different thicknesses. By patterning various layers with foregoing patterned photoresist layer as a mask, only two mask processes are required for fabricating the active device array substrate according to the present invention. Therefore, both the fabrication cost and the fabrication time are effectively reduced, and accordingly, the throughput is significantly increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A~1H are cross-sectional views illustrating a fabrication method of an active device array substrate according to a first embodiment of the present invention.

FIGS. 3A~3H are cross-sectional views illustrating a fabrication method of an active device array substrate according to a second embodiment of the present invention.

DESCRIPTION OF THE EMBODIMENTS

Figure 1A:
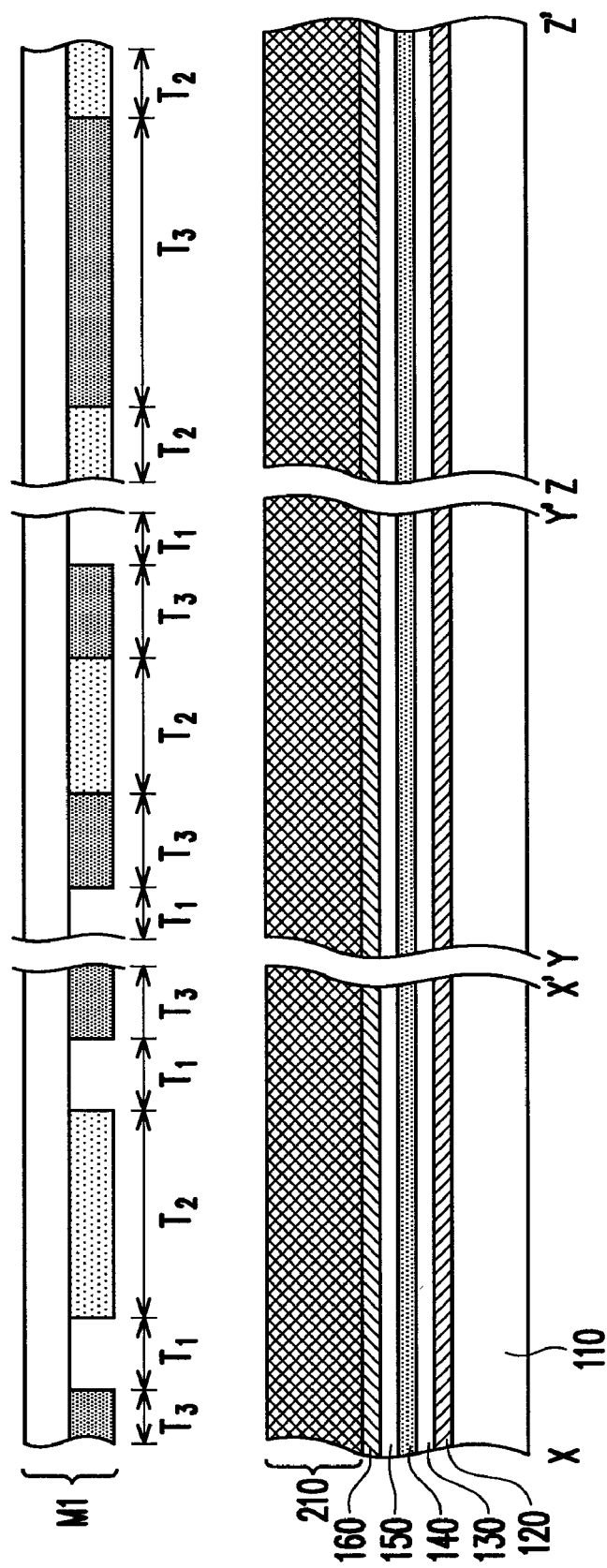

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1B:
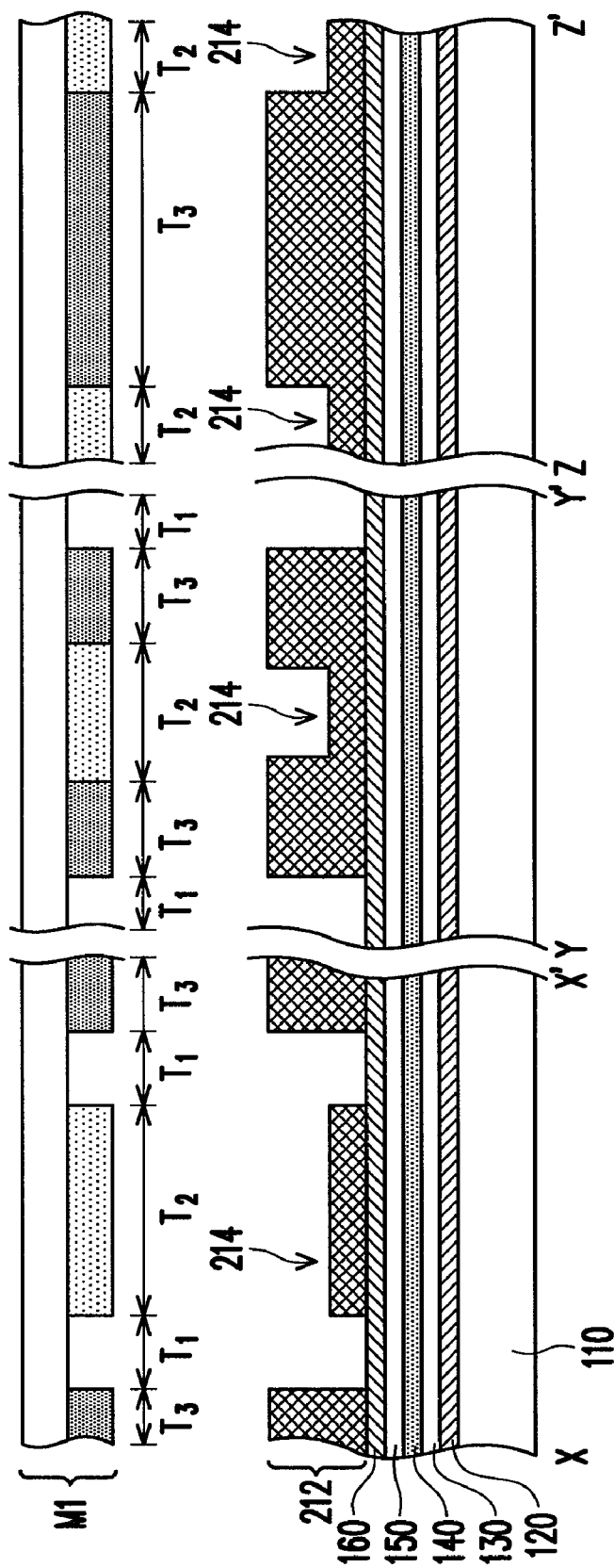
Figure 1C:
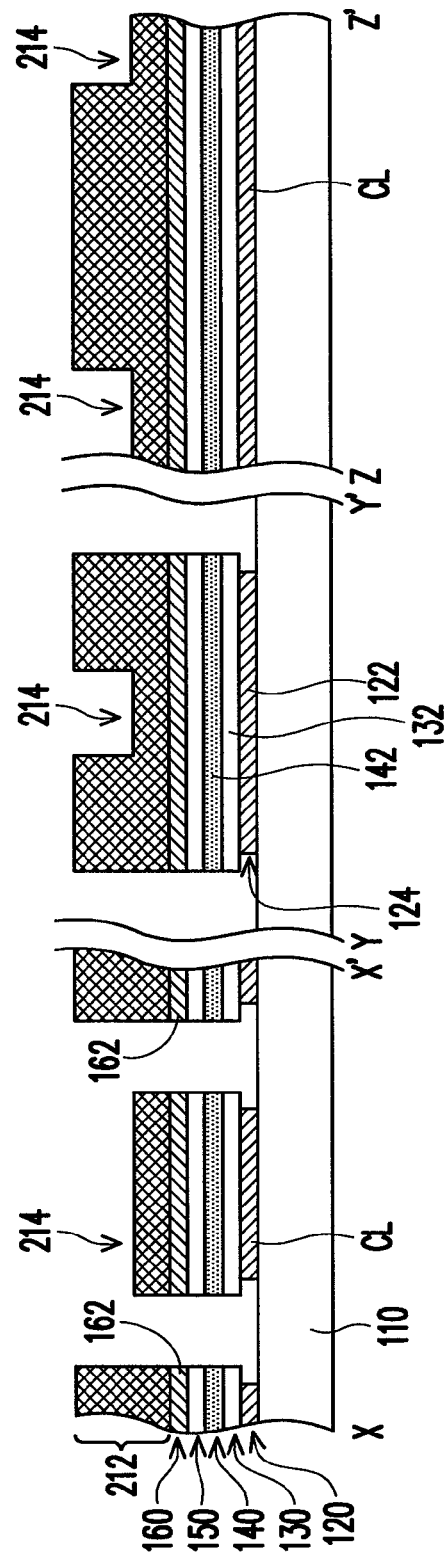
Figure 1D:
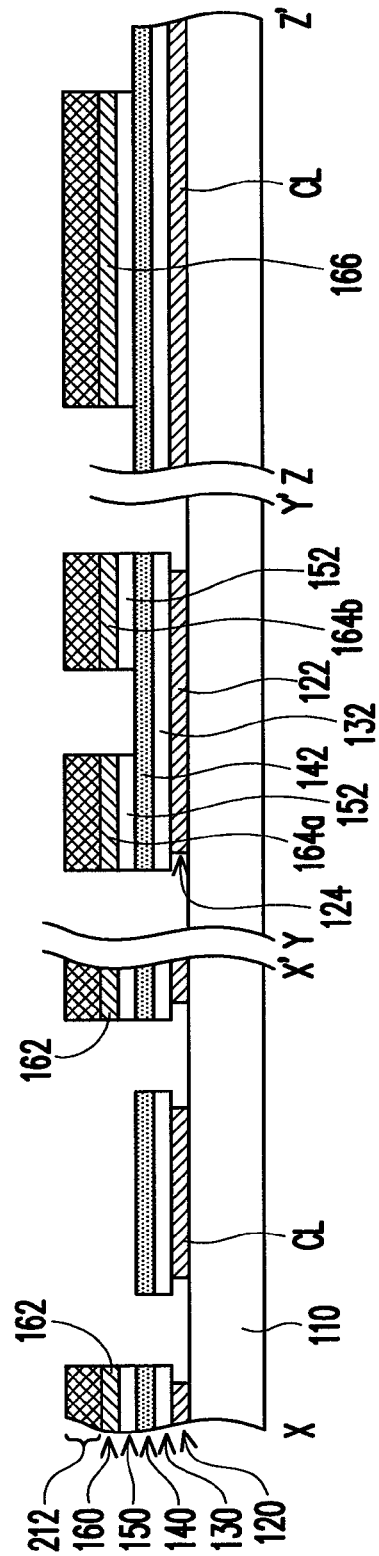
Figure 2A:
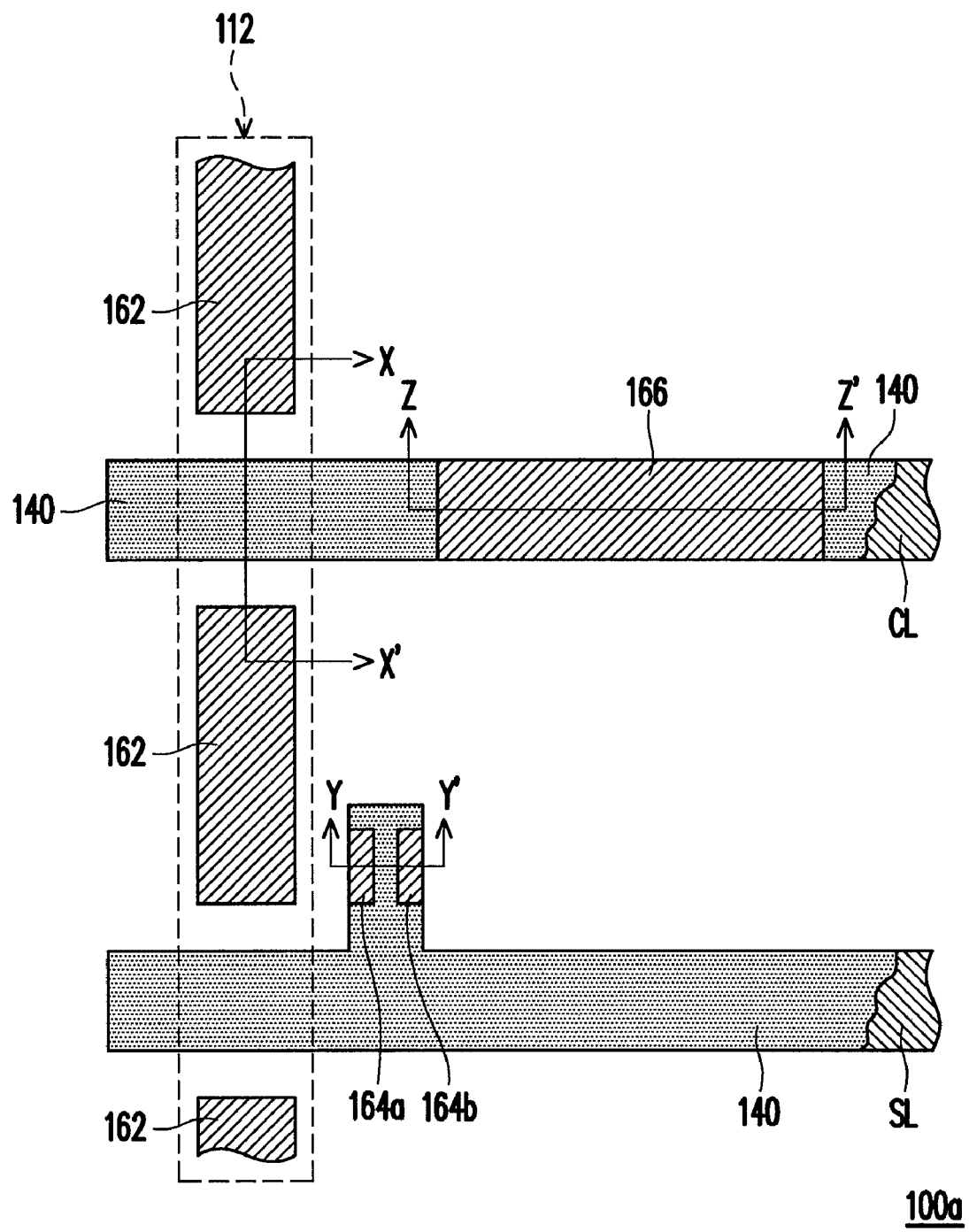
FIGS. 2A~2B are partial top views illustrating the fabrication method of the active device array substrate according to the first embodiment of the present invention.
Figure 2B:
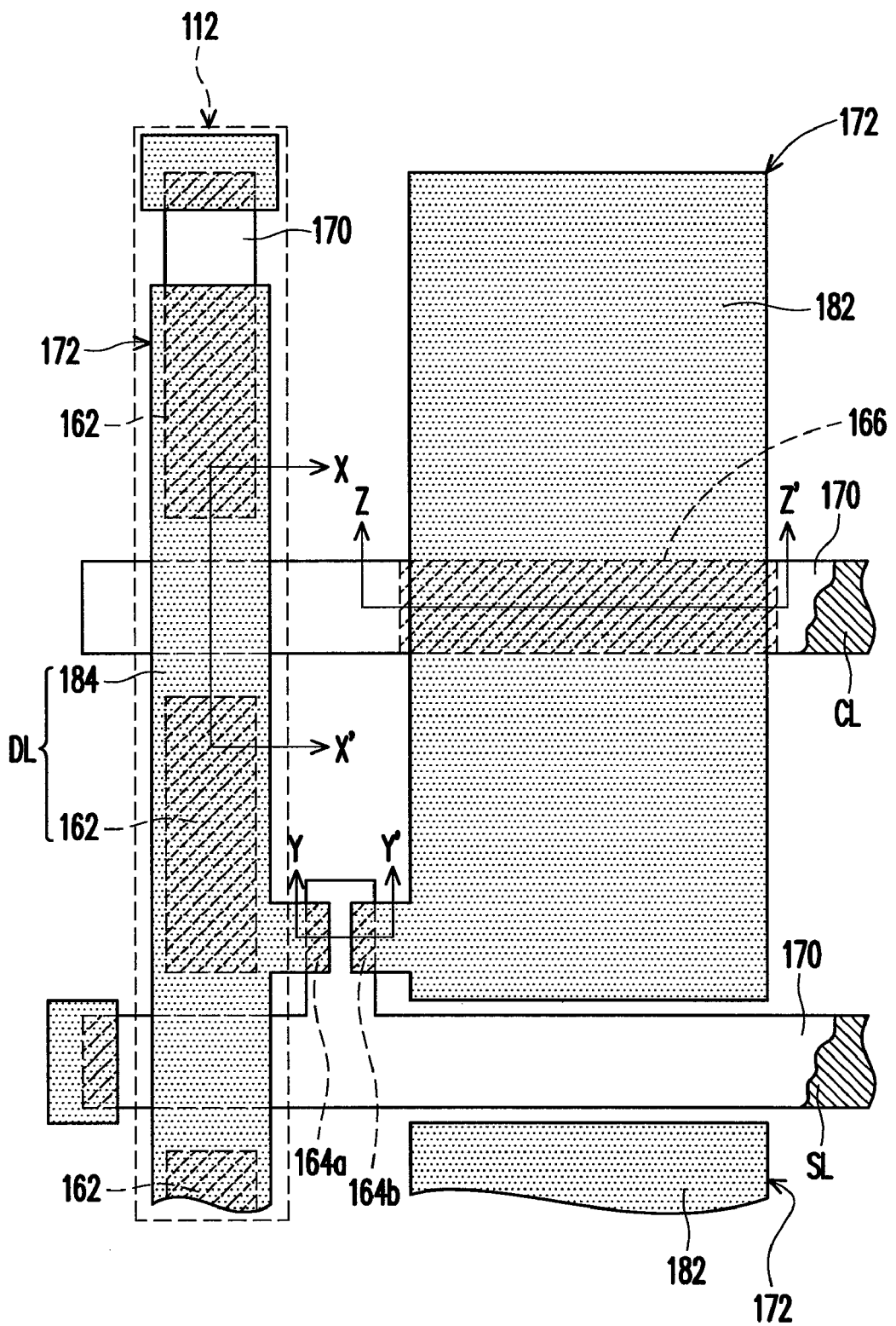

FIGS. 1A~1H are cross-sectional views illustrating a fabrication method of an active device array substrate according to a first embodiment of the present invention, and FIGS. 2A~2B are partial top views illustrating the fabrication method of the active device array substrate according to the first embodiment of the present invention. Referring to FIG. 1A, first, a substrate 110 is provided. Next, a first metal material layer 120, a gate insulation material layer 130, a channel material layer 140, a second metal material layer 160, and a first photoresist layer 210 are sequentially formed on the substrate 110.

More specifically, the first metal material layer 120 may be formed by depositing a metal material on the substrate 110 through physical vapor deposition (PVD), and the material thereof may be of a low resistance material, such as Al, Au, Cu, Mo, Cr, Ti, Al alloy, or Mo alloy. The gate insulation material layer 130 may be deposited on the first metal material layer 120 through chemical vapor deposition (CVD), and the material thereof may be SiO formed using SiN or tetra-ethyl-ortho-silicate (TEOS) as a reactive gas.

The channel material layer 140 may be formed by depositing amorphous silicon (a-Si) on the gate insulation material layer 130 through CVD, and the second metal material layer 160 may be formed by depositing a metal material on the channel material layer 140 through PVD, and the second metal material layer 160 may be fabricated with the same or similar conductive material as the first metal material layer 120. Besides, in the present embodiment, the first photoresist layer 210 may adopt positive photoresist.

It should be noted that in order to reduce the contact resistance between the channel material layer 140 and the second metal material layer 160, an ohmic contact material layer 150 may be further formed between the channel material layer 140 and the second metal material layer 160. The ohmic contact material layer 150 may be formed by performing an ion doping process after the channel material layer 140 is formed, wherein the material of the ohmic contact material layer 150 may be N-doped a-Si.

Next, a multi-tone mask M1 is provided, wherein the multi-tone mask M1 may be a half-tone mask. The multi-tone mask M1 has a first transmissive region T1, a second transmissive region T2, and a third transmissive region T3. To be specific, the transmittance of the first transmissive region T1 is greater than that of the second transmissive region T2, and the transmittance of the second transmissive region T2 is greater than that of the third transmissive region T3. In the present embodiment, the third transmissive region T3 may be a non-transmissive region.

Thereafter, referring to FIG. 1B, the first photoresist layer 210 is patterned with the multi-tone mask M1 to form a first patterned photoresist layer 212. It should be noted that since the multi-tone mask M1 has three different transmittances, the first patterned photoresist layer 212 formed by patterning the first photoresist layer 210 also has two different residual thicknesses. Because the first transmissive region T1 has the highest transmittance, the first photoresist layer 210 corresponding to the first transmissive region T1 is removed after the first photoresist layer 210 is patterned, so that the second metal material layer 160 corresponding to the first transmissive region T1 is exposed by the first patterned photoresist layer 212.

Additionally, according to the present embodiment, since the third transmissive region T3 is a non-transmissive region, the first photoresist layer 210 corresponding to the third transmissive region T3 is not removed. Besides, since the transmittance of the second transmissive region T2 is between the transmittance of the first transmissive region T1 and the transmittance of the third transmissive region T3, the thickness of the first photoresist layer 210 corresponding to the second transmissive region T2 is smaller than that of the first photoresist layer 210 corresponding to the third transmissive region T3, and accordingly a concave pattern 214 is formed.

Next, referring to FIG. 1C, a first removing process is performed using the first patterned photoresist layer 212 as a mask to remove the second metal material layer 160, the ohmic contact material layer 150, the channel material layer 140, the gate insulation material layer 130, and the first metal material layer 120 not covered by the first patterned photoresist layer 212, so as to form a gate 122, a gate insulation layer 132, and a channel layer 142. Generally speaking, the first removing process may be an anisotropic wet etching process.

In the present embodiment, the first removing process further includes over etching the first metal material layer 120 to form an undercut concave 124 at a side of the gate 122, as shown in FIG. 1C. Similarly, a plurality of undercut concaves 124 as shown in FIG. 1C are also formed at the sides of the first metal material layer 120 below a plurality of first sub data line segments 162. The function of the undercut concaves 124 will be described in detail later on.

Next, referring to FIG. 1D, a second removing process is performed to remove the concave pattern 214 of the first patterned photoresist layer 212 and the ohmic contact material layer 150 and the second metal material layer 160 under the concave pattern 214, so as to form an ohmic contact layer 152, a source 164a and a drain 164b and expose a part of the channel layer 142. The second removing process may be an isotropic dry etching process. After that, the first patterned photoresist layer 212 is removed.

Referring to FIG. 2A, in the first removing process, a scan line SL and a common line CL (both formed from the first metal material layer 120) may be further formed, and the first sub data line segments 162 (formed from the second metal material layer 160) may be further formed in a data line predetermined region 112 on the substrate 110, wherein the scan line SL is electrically connected to the gate 122, and the common line CL may be parallel to the scan line SL. Besides, the extending direction of the first sub data line segments 162 may intersect the extending directions of the scan line SL and the common line CL. It should be noted that the first metal material layer 120 below the first sub data line segments 162 is not electrically connected to the scan line SL and the common line CL.

In addition, in the first removing process, a storage capacitance electrode 166 may be further formed above the common line CL, wherein the gate 122, the scan line SL, and the common line CL may be formed from the first metal material layer 120, and the first sub data line segments 162, the source 164a, the drain 164b, and the storage capacitance electrode 166 may be formed from the second metal material layer 160.

Next, referring to FIG. 1E, a passivation layer 170 and a second patterned photoresist layer 220a are sequentially formed on the substrate 110. The passivation layer 170 may be formed on the substrate 110 through CVD, and the material thereof may be SiO, SiN, or SiON. The second patterned photoresist layer 220a is formed by performing a patterning process with a mask. More specifically, the passivation layer 170 covers a part of the substrate 110, a part of the channel layer 142, the first sub data line segments 162, the source 164a, the drain 164b, and the storage capacitance electrode 166, and the second patterned photoresist layer 220a has a plurality of openings 222, wherein these openings 222 expose the passivation layer 170 above the first sub data line segments 162, the source 164a, the drain 164b, and the storage capacitance electrode 166.

Next, referring to FIG. 1F, a third removing process is performed using the second patterned photoresist layer 220a as a mask to remove a part of the passivation layer 170 and form a plurality of contact holes 172, so as to expose the first sub data line segments 162, the source 164a, the drain 164b, and the storage capacitance electrode 166.

Next, referring to FIG. 1G, a pixel electrode material layer 180 is formed on the passivation layer 170 and the second patterned photoresist layer 220a to cover the second patterned photoresist layer 220a and the exposed first sub data line segments 162, source 164a, drain 164b, and storage capacitance electrode 166. The pixel electrode material layer 180 may be formed on the substrate 110 through CVD, and the material thereof may be indium tin oxide (ITO), indium zinc oxide (IZO), or aluminum zinc oxide (AZO).

It should be noted that since the second patterned photoresist layer 220a is quite thick and the sidewalls of the openings 222 thereof are nearly vertical, it is difficult to form the pixel electrode material layer 180 on the sidewalls of the openings 222. Particularly, since the undercut concaves 124 are formed at the side of the gate 122 and the sides of the first metal material layer 120 below the first sub data line segments 162, the pixel electrode material layer 180 formed on the substrate 110 is not electrically connected to the gate 122 and the first metal material layer 120 below the first sub data line segments 162.

Next, referring to FIG. 1H, a lift-off process is performed to lift off the second patterned photoresist layer 220a and remove the pixel electrode material layer 180 over the second patterned photoresist layer 220a, so as to form a pixel electrode 182. Besides, the pixel electrode 182 is electrically connected to the storage capacitance electrode 166 through the contact hole 172, and a part of the common line CL and the storage capacitance electrode 166 form a storage capacitor.

Thereafter, referring to FIG. 2B, a plurality of second sub data line segments 184 may be further formed along the extending direction of the first sub data line segments 162 in the data line predetermined region 112 when the pixel electrode 182 is formed, wherein the pixel electrode 182 and the second sub data line segments 184 are all formed from the pixel electrode material layer 180. More specifically, the second sub data line segments 184 are electrically connected between two first sub data line segments 162 to form a data line DL.

As described above, in the fabrication method provided by the present invention, an active device array substrate 100a can be fabricated by performing only two mask processes along with some removing processes. Therefore, the fabrication method provided by the present invention can effectively reduce the fabrication cost of active device array substrates.

Figure 3A:
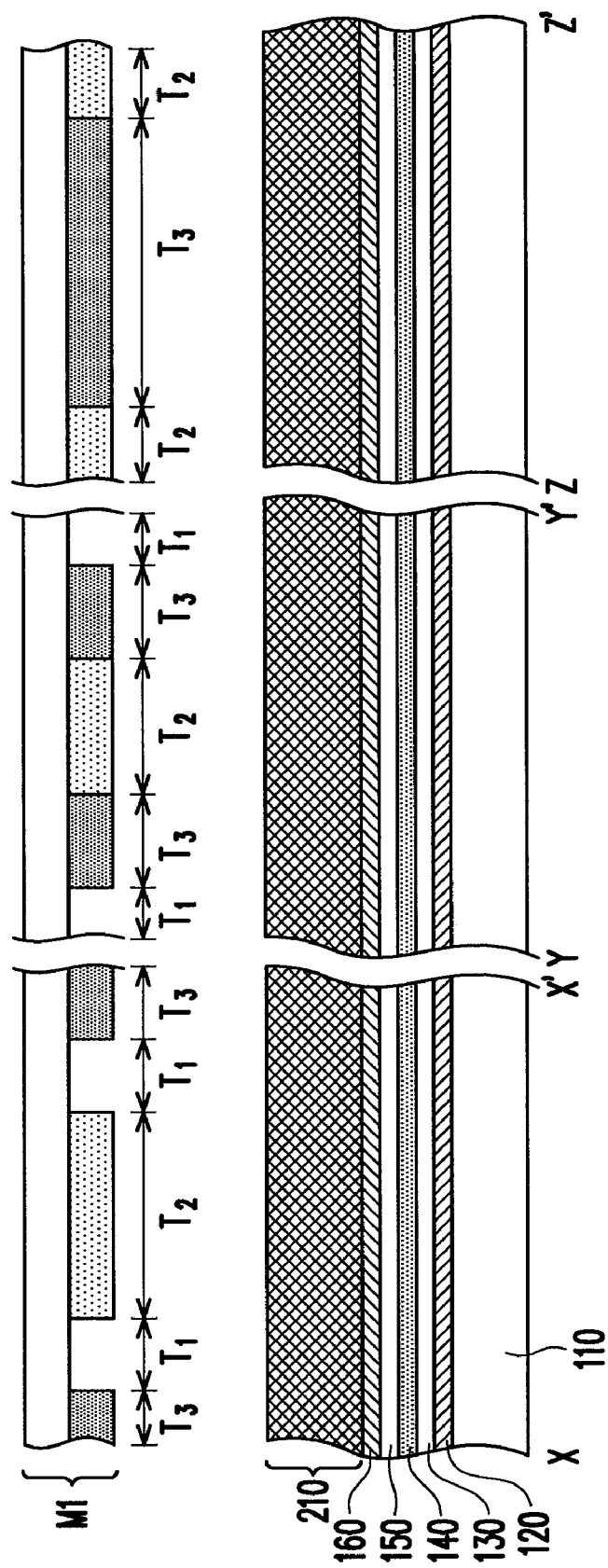
Figure 3B:
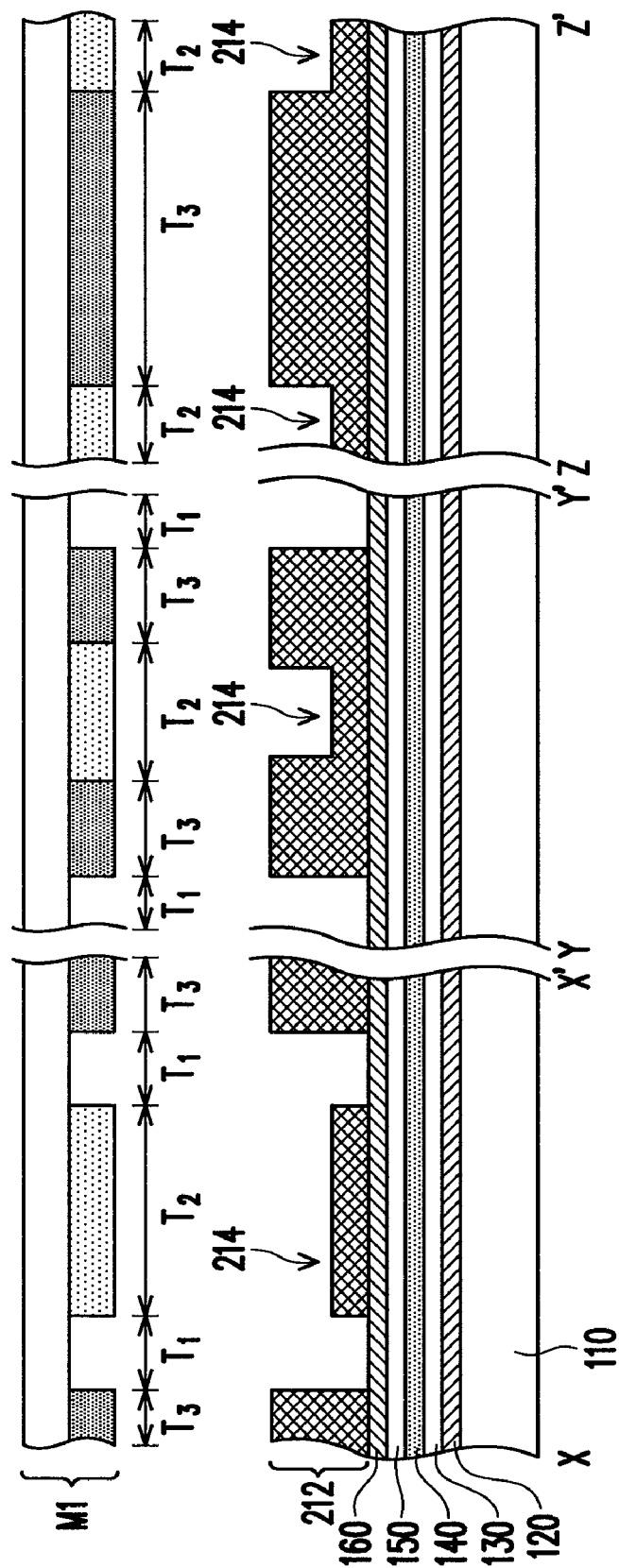
Figure 3C:
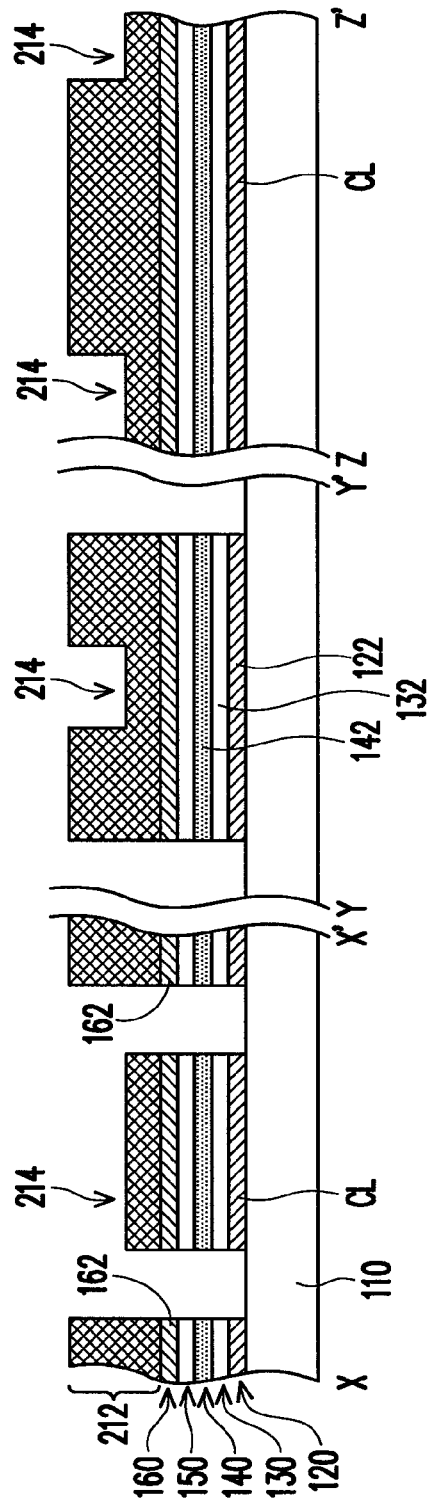
Figure 3D:
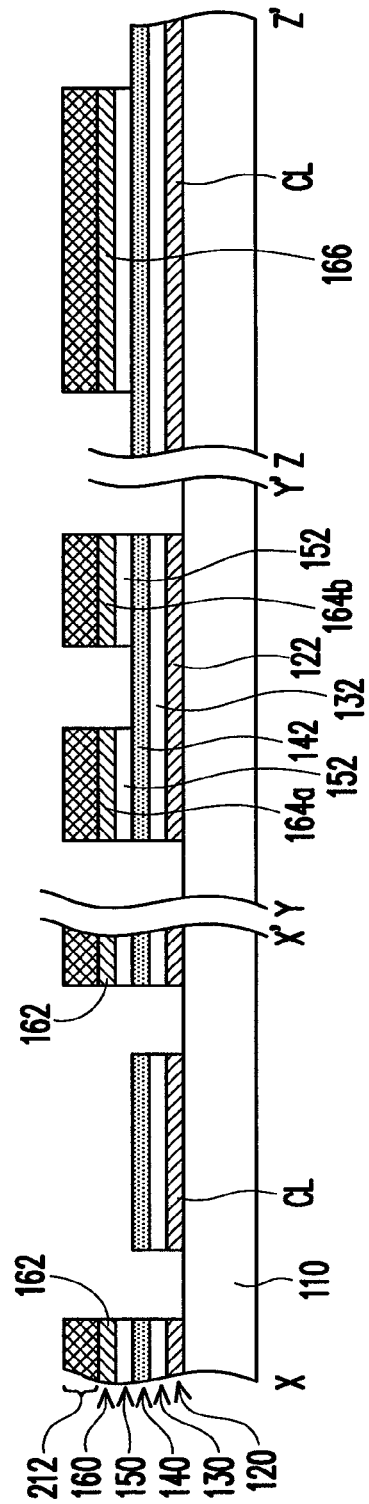
Figure 3G:
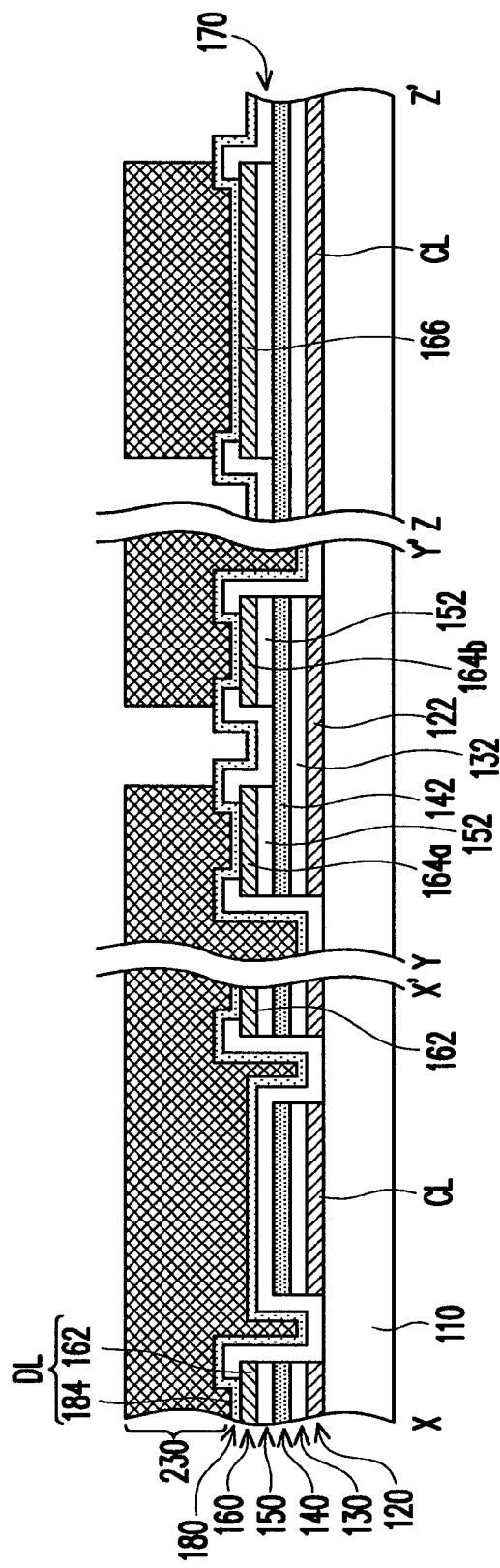
Figure 3H:
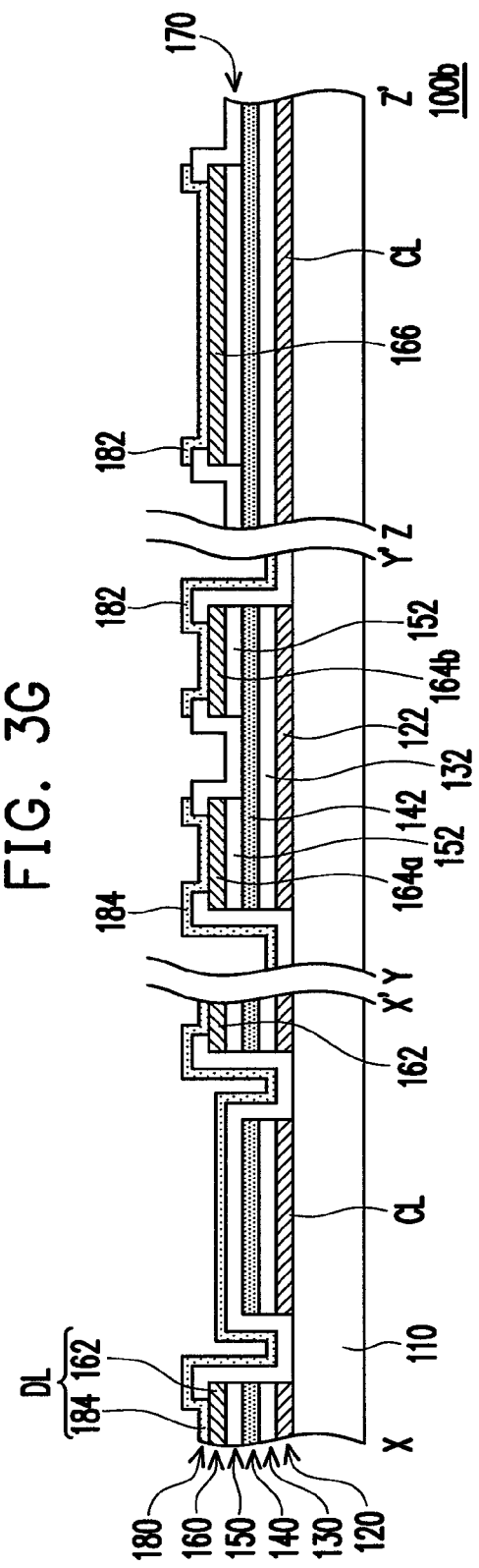
Figure 4A:
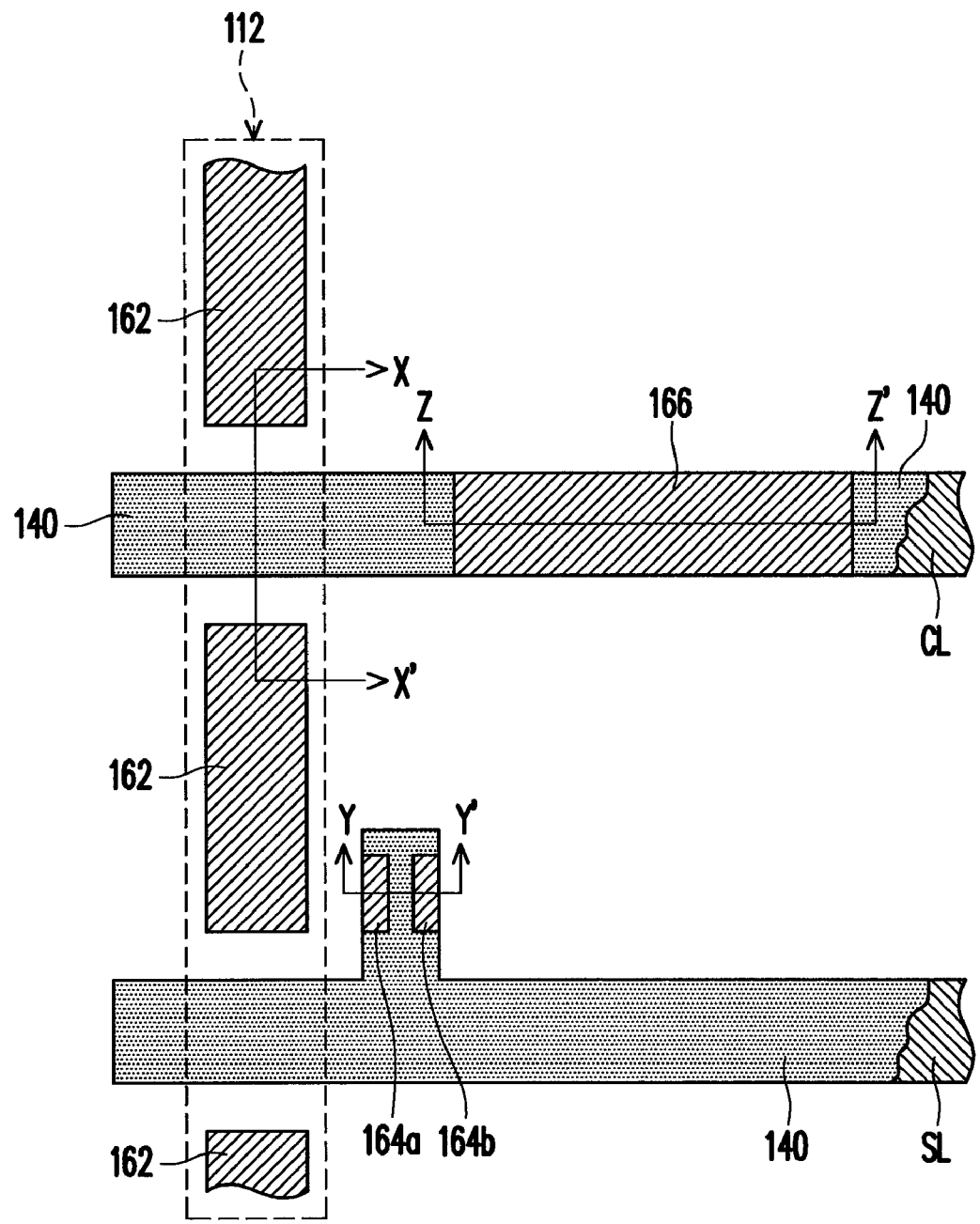
FIGS. 4A~4C are partial top views illustrating the fabrication method of the active device array substrate according to the second embodiment of the present invention.
Figure 4B:
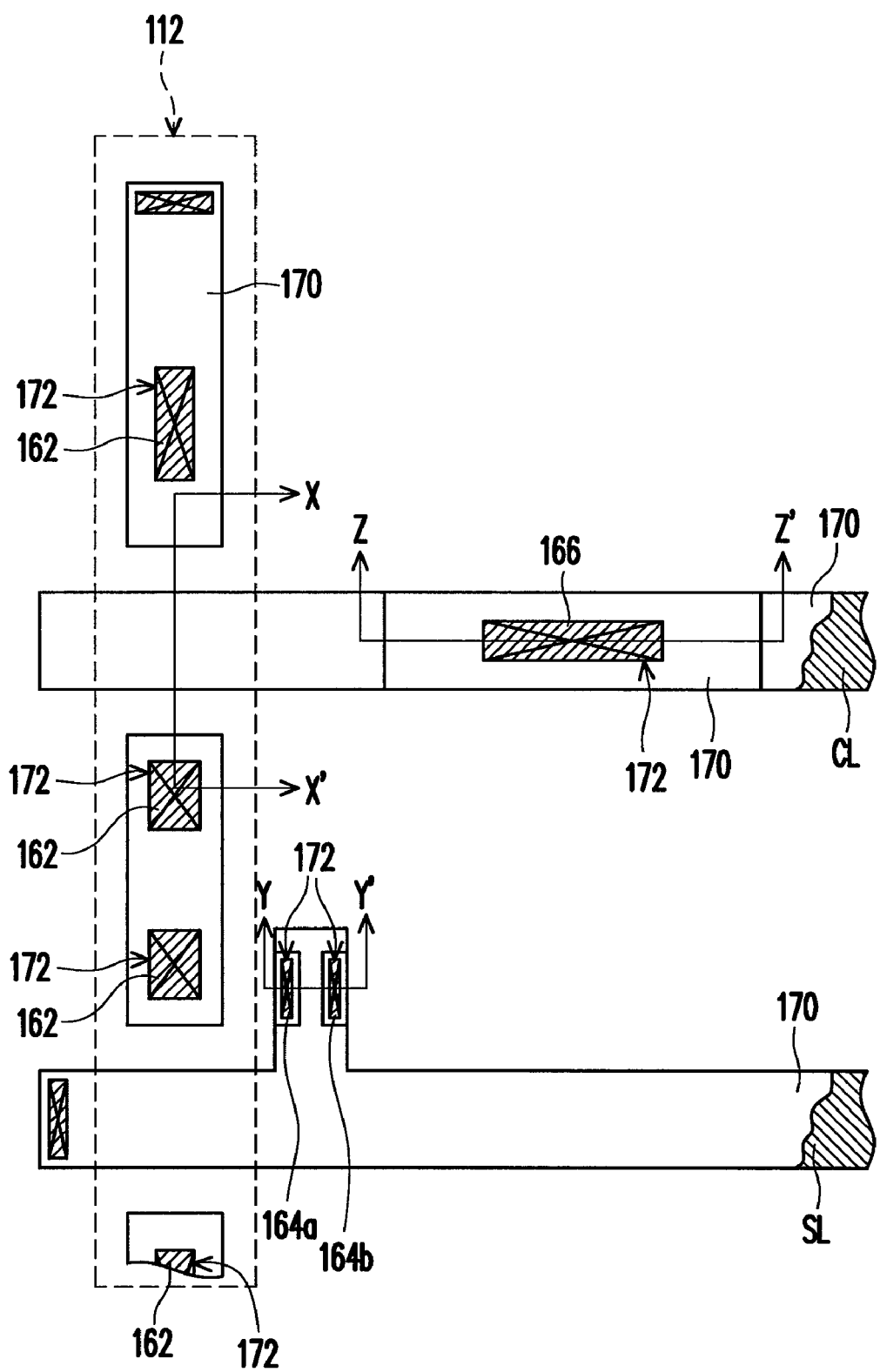
Figure 4C:
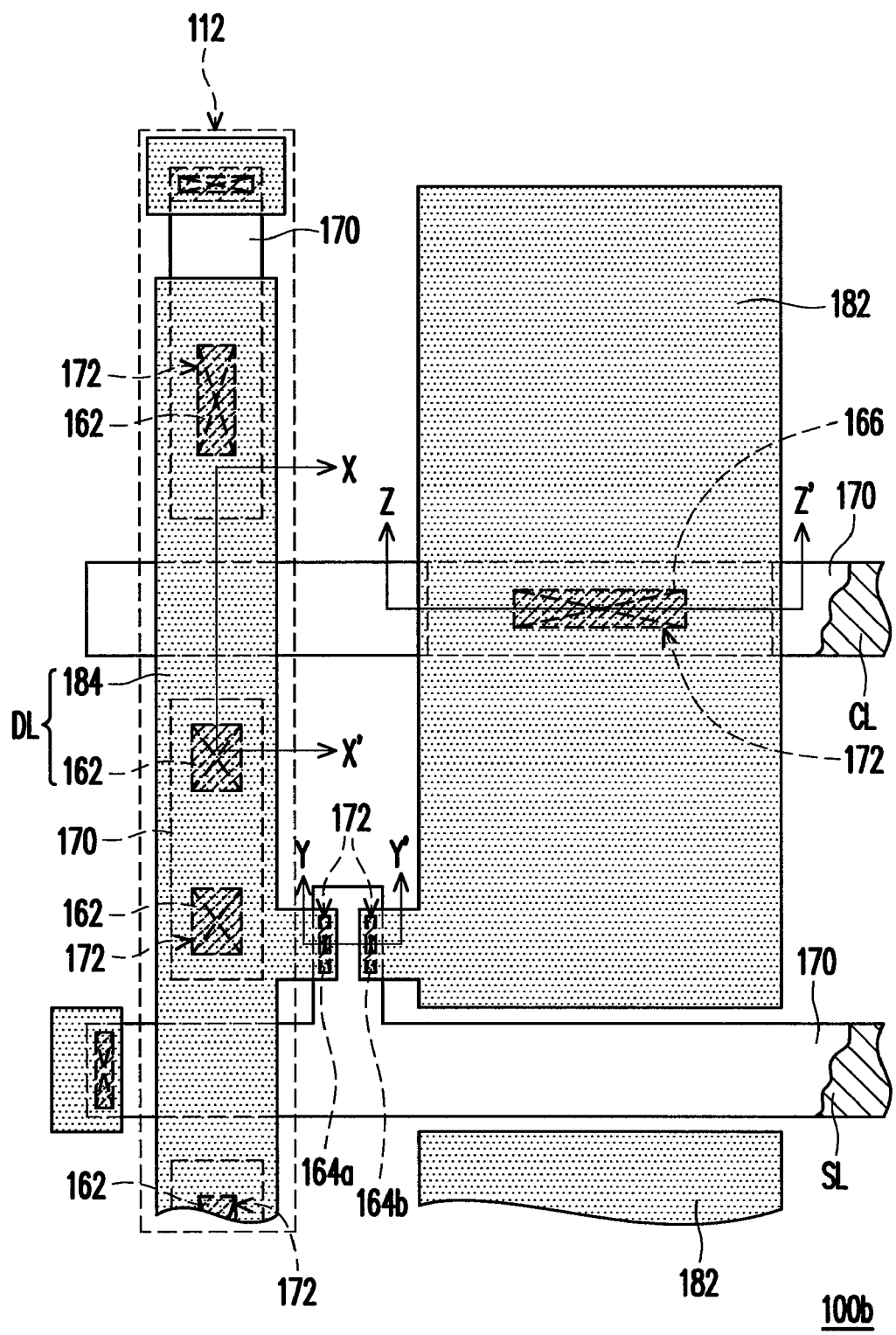

FIGS. 3A~3H are cross-sectional views illustrating a fabrication method of an active device array substrate according to a second embodiment of the present invention, and FIGS. 4A~4C are partial top views illustrating the fabrication method of the active device array substrate according to the second embodiment of the present invention. The second embodiment is similar to the first embodiment, except for a third patterned photoresist layer 230 is used as a mask for forming the pixel electrode 182 and the second sub data line segments 184.

Referring to FIGS. 3A~3D and FIG. 4A, first, a first metal material layer 120, a gate insulation material layer 130, a channel material layer 140, a second metal material layer 160, and a first photoresist layer 210 are sequentially formed on a substrate 110. Next, the first photoresist layer 210 is patterned with a multi-tone mask M1 to form a first patterned photoresist layer 212. Next, a first removing process and a second removing process are sequentially performed using the first patterned photoresist layer 212 as a mask to form a gate 122, a gate insulation layer 132, a channel layer 142, a scan line SL, a common line CL, a plurality of first sub data line segments 162, a source 164a, a drain 164b, a storage capacitance electrode 166, and an ohmic contact layer 152 on the substrate 110. The steps and materials for forming foregoing layers are similar to those described in the first embodiment (referring to FIGS. 1A~1D and FIG. 2A) therefore will not be described repeated herein.

Next, referring to FIG. 3E, a passivation layer 170 and a second patterned photoresist layer 220b are sequentially formed on the substrate 110, wherein the steps and materials for forming the passivation layer 170 are similar to those described in the first embodiment therefore will not be described herein. After that, a third removing process is performed using the second patterned photoresist layer 220b as a mask to remove a part of the passivation layer 170. Thereafter, referring to FIG. 3F and FIG. 4B, a plurality of contact holes 172 are formed on the passivation layer 170 to expose a part of the first sub data line segments 162, a part of the source 164a, a part of the drain 164b, and a part of the storage capacitance electrode 166. After that, the second patterned photoresist layer 220b is removed.

It should be noted that compared to the first embodiment of the present invention, the openings 222 of the second patterned photoresist layer 220b in the second embodiment expose only a small portion of the passivation layer 170. Accordingly, after the third removing process is performed, the contact holes 172 of the passivation layer 170 expose only a small portion of the second metal material layer 160. Moreover, since the passivation layer 170 can completely cover the exposed substrate 110 after the first removing process is performed, the first metal material layer 120 need not be over etched to form the undercut concaves 124 during the first removing process.

Next, referring to FIG. 3G, a pixel electrode material layer 180 and a third patterned photoresist layer 230 are sequentially formed on the substrate 110. The steps and materials for forming the pixel electrode material layer 180 are similar to those described in the first embodiment therefore will not be described repeated herein. Next, referring to FIG. 3H, the pixel electrode material layer 180 is patterned using the third patterned photoresist layer 230 as a mask to form a pixel electrode 182. Here, a storage capacitor is formed between the common line CL and the pixel electrode 182. Next, the third patterned photoresist layer 230 is removed.

In addition, referring to FIG. 4C, a plurality of second sub data line segments 184 may be further formed in a data line predetermined region 112 on the substrate 110 along the extending direction of the first sub data line segments 162 when the pixel electrode material layer 180 is patterned, wherein the pixel electrode 182 and the second sub data line segments 184 may be formed from the pixel electrode material layer 180, the pixel electrode 182 is electrically connected to the drain 164b, and one of the second sub data line segments 184 is electrically connected to the source 164a. Moreover, each of the second sub data line segments 184 is electrically connected between two first sub data line segments 162 to form a data line DL. As described above, in the fabrication method provided by the present invention, an active device array substrate 100b can be fabricated by performing only three mask processes along with some removing processes. Therefore, the fabrication method provided by the present invention can effectively reduce the fabrication cost of active device array substrates.

In summary, in the fabrication method of an active device array substrate provided by the present invention, a multitone mask is used for patterning a first photoresist layer so that the first patterned photoresist layer can have two different thicknesses, and accordingly, the gate, the gate insulation layer, the channel layer, and the source/drain can be fabricated by performing only one mask process along with some removing processes. Thus, only two or three mask processes are required for fabricating active device array substrates according to the present invention. Therefore, both the fabrication cost and the fabrication time can be effectively reduced and the throughput can be effectively increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
   a substrate;
   a scan line, disposed over the substrate; and
   an active device, disposed over the substrate, wherein the active device comprises:
      a gate, disposed over the substrate and electrically connected to the scan line;
      a gate insulation layer, disposed over the gate, wherein a width of the gate insulating layer is greater than a width of the gate such that an undercut concave is formed at a side of the gate with respect to the gate insulating layer;
      a channel layer, disposed over the gate insulation layer;
      a source/drain, respectively disposed over both sides of the channel layer; and
   a passivation layer, covering the active device and the scan line, wherein the passivation layer comprises a plurality of contact holes, and a part of the contact holes exposes the source/drain;
   a pixel electrode, disposed over the passivation layer and electrically connected to the drain through a part of the contact holes;
   a plurality of first sub data line segments; and
   a plurality of second sub data line segments, wherein the first sub data line segments and the source/drain are located on the same layer, the second sub data line segments and the pixel electrode are located on the same layer, the second sub data line segments are electrically connected between two of the first sub data line segments through a part of the contact holes to form a data line, and one of the second sub data line segments is electrically connected to the source through the corresponding contact hole.

2. The active device array substrate according to claim 1 further comprising a common line disposed over the substrate, wherein the common line and the gate are located on the same layer.

3. The active device array substrate according to claim 2 further comprising a storage capacitance electrode disposed above the common line, wherein the passivation layer is located between the storage capacitance electrode and the pixel electrode, and the pixel electrode is electrically connected to the storage capacitance electrode through the corresponding contact hole.

* * * * *